United States Patent [19]

Legresy et al.

[11] Patent Number: 5,160,388

[45] Date of Patent: Nov. 3, 1992

[54] PROCESS FOR PRODUCING CATHODES FOR CATHODIC SPUTTERING BASED ON ALUMINIUM-SILICON ALLOYS

[75] Inventors: Jean-Marc Legresy, St. Egreve; Marc-Henri Marticou, Foix, both of France

[73] Assignee: Aluminium Pechiney, France

[21] Appl. No.: 727,043

[22] Filed: Jul. 9, 1991

[30] Foreign Application Priority Data

Jul. 10, 1990 [FR] France ............................ 90 093976

[51] Int. Cl.$^5$ .......................... C22F 1/04; C23C 14/00
[52] U.S. Cl. .................................. 148/552; 148/437; 148/695; 148/698; 204/298.13
[58] Field of Search ...................... 148/2, 11.5 A, 437, 148/549, 552, 698; 420/548; 204/298.13

[56] References Cited

U.S. PATENT DOCUMENTS 4,797,164  1/1989  Höllrigl et al. .................... 148/2

FOREIGN PATENT DOCUMENTS 2164280  3/1986  United Kingdom .

Primary Examiner—R. Dean
Assistant Examiner—Robert R. Koehler
Attorney, Agent, or Firm—Pollock, Vande Sande & Priddy

[57] ABSTRACT

The invention relates to a process for the production of targets to be used in the vacuum deposition of aluminium alloy by cathodic sputtering.

The process consists of a heat treatment of the aluminium alloy disks making it possible to obtain a fine grain. It is characterized by the dissolving of the silicon, followed by controlled cooling bringing about the fine precipitation of the silicon and an optional silicon spheroidization treatment. After cooling, the disks are deformed with the press and undergo a final recrystallization treatment.

The process is applied to the production of targets or cathodes for the coating of semiconductor silicon wafers by cathodic sputtering.

6 Claims, 3 Drawing Sheets

PROCESS FOR PRODUCING CATHODES FOR CATHODIC SPUTTERING BASED ON ALUMINIUM-SILICON ALLOYS

DESCRIPTION OF THE PROBLEM

The invention relates to a process for the production of targets or cathodes made from aluminum-silicon alloy and intended for cathodic sputtering on a substrate.

The cathodic sputtering process is e.g. described in "Techniques de l'ingenieur", M 1657-2 and the following section is quoted from it: "Cathodic sputtering is a vacuum deposition process operating cold, in a luminescent plasma and a gas kept at a reduced pressure ($10^{-1}$ to $10^2$ Pa). It permits the deposition of all material types, single or composite, refractory or not, alloyed or not, conductive or dielectric. All types of substrate which can be placed under a vacuum and accept slight heating can be treated by this process.

The material to be deposited and which is referred to as the target material is introduced into the vacuum enclosure, in the form of a plate a few millimeters thick and with a size substantially equal to that of the part to be coated. This target is fixed to a cooled electrode (the cathode), which is raised to a negative voltage of 3 to 5 kV. A second electrode (the anode) is arranged parallel to the target at a distance of a few cm. In numerous cases the anode serves as the substrate holder and is generally earthed, which facilitates this use.

If the residual pressure in the enclosure is between 1 Pa and $10^2$ Pa, the electrical field created between the two electrodes brings about the ionization of the residual gas. This ionization appears in the form of a luminescent cloud, located between the two electrodes. At the same time, an electric current is established between the two electrodes. The residual gas has become conductive and then contains electrons, which are attracted by the anode and positive ions, which are attracted by the target (the cathode).

If a part is positioned in front of the target, said part becomes progressively covered with a coating of the same material as that of the plate constituting the target. This deposition is due to the condensation of atoms from the target and expelled therefrom under the effect of the impact of positive ions contained in the luminescent gas and attracted by the target as a result of its negative polarization."

An application of this procedure is in electronics. It consists of coating with an aluminium alloy semiconductor silicon wafers. The aluminium alloy generally used is an aluminium-silicon alloy containing 0.5 to 2% by weight silicon. Silicon must be present in order to reduce the diffusion of silicon into the aluminium and of aluminium into the silicon. If such diffusions occur, they create spikes, which are prejudicial to the active devices of printed circuits.

Obviously the aluminium and silicon must be very pure, namely at least 99.99% and in particular the aluminium must be free from impurities producing alpha radiation. Apart from silicon, which constitutes the main addition element of the alloy, other addition elements can be used in the composition of the alloy.

Another characteristic required by these targets is that the grain, i.e. the size of the elementary metal crystals forming the target is as fine or small as possible. This is necessary to ensure a regular emission of the metal atoms torn away from the target. However, all metallurgists know that it is very difficult to obtain a fine grain on products produced from extremely pure metals. The conventional processes for refining the foundry grain by adding conventional refining agents serving as nuclei, such as titanium boride, are in the present case completely unusable as a result of the requirement that the metal is pure.

DESCRIPTION OF THE PRIOR ART

The process generally used for the production of targets in the prior art is as follows:

1) Casting billets or disks

Semicontinuous casting takes place of billets having a diameter appropriate for the target to be obtained. In order to obtain a certain degree of refining of the foundry grain, during casting mechanical stirring occurs to the liquid part of the continuously cast billet. This mechanical stirring takes place with the aid of a stirrer immersed in the liquid part and which is of the screw or blade type as a function of the obtaining of a maximum efficiency. The refining of the grain obtained in this way is due to the mechanical fractionation of the dendrites of the solid phase being formed. It is also possible to cast, e.g. into a metal mould, disks of a diameter appropriate for the target to be obtained.

2) Deformation of the billet sections

The billets are then cut into sections having a thickness appropriate for the final target thickness. The disks obtained this way or directly by moulding then undergo a certain cold working by means of a deformation, which reduces the disk thickness, whilst homogeneously increasing its dimensions in all directions perpendicular to the thickness. This deformation is generally a uniaxial compression carried out by means of a press.

3) Recrystallization

The metal of the disk cold worked in this way and whose foundry grain has been deformed by cold working can thus undergo recrystallization. This heat treatment takes place in a conventional manner at a temperature of 300° to 350° C. for between 5 minutes and 2 hours.

4) Result obtained

Following the heat treatment described hereinbefore, the disks have a recrystallization grain which is not less than 200 micrometers and whose size is not homogeneous over the entire disk volume. After machining to the final dimensions, the disks can be used as targets for the cathodic sputtering of the aluminium-silicon alloy.

However, this widely used process suffers from the two disadvantages that the mechanical stirring, even when carried out carefully, always leads to the risk of oxide inclusions being introduced into the liquid part of the continuously cast billet and the grain obtained is still not as fine as would be desired.

DESCRIPTION OF THE INVENTION

The process according to the invention aims at obviating the two aforementioned disadvantages and comprises:

1) carrying out a special heat treatment on the disks cut from the billet or which have been moulded prior to the deformation thereof for reducing their thickness and whilst still homogeneously increasing their dimensions in all directions perpendicular to the thickness and 2) in preferred manner, during the casting of the billet, carrying out an electromagnetic stirring of the liquid part of the billet in order to refine the foundry grain.

The heat treatment takes place on the disks cut from the billets obtained by semicontinuous casting or which have been cast in the mould. It comprises the following stages.

A homogenization stage at a temperature and for a time adequate to pass all the silicon, whereof a part has precipitated on casting, into solid solution in the aluminium, but without burning the alloy. This operation has the secondary effect of increasing the foundry grain size and therefore apparently moves in the opposite direction to the sought objective of obtaining a fine grain. This stage e.g. consists of raising the disks to a temperature between 450° and 570° C. and preferably approximately 540° C. and they are maintained at this temperature for more than 4 hours.

A stage of precipitating the silicon dissolved in the aluminium phase during the preceding stage. The silicon precipitate must according to the invention, be fine and spherical. In order to initiate such a precipitation, it is necessary to cool the metal to a temperature range where the solubility of the silicon is sufficiently reduced and in accordance with a sufficiently slow law to obtain the sought precipitate fineness. The sought silicon precipitate concentration is between $10^5/cm^3$ and $10^{10}/cm^3$. It has e.g. been found that it is necessary to cool the metal to a temperature between 330° and 450° C. at a rate between 10° and 200° C./hour.

An optional stage of maintaining at the temperature reached at the end of the precipitation stage in order to complete the precipitation and spheroidization of the silicon particles. This must last a sufficient time to ensure that the shape factor of the silicon precipitates, i.e. the ratio of their smallest to their largest size is between 1 and 0.1 and such a treatment generally lasts more than 1 hour.

A final stage of cooling to ambient temperature at a rate between 5° and 100° C./hour.

Following this heat treatment, which forms the object of the invention, a deformation and a recrystallization treatment are performed in accordance with the aforementioned prior art.

Micrographic examination of the billet sections treated according to the invention makes it possible to establish that the grain size is considerably reduced compared with the sections treated according to the prior art. Thus, the grain size is between 50 and 80 micrometers instead of 200 micrometers in the prior art. It would appear that this significant reduction is due to the fine precipitation of the silicon which, by creating a large number of recrystallization nuclei, limits the growth of the grains.

One of the preferred conditions for performing the invention is the combination of the aforementioned heat treatment with an electromagnetic stirring of the liquid part of the billet during casting.

In particular, it has been found that the electromagnetic stirring process described in the French patent filed on Sep. 19, 1984 under No. 84 147410 and granted on Nov. 3, 1986 under No. 2570304 is preferably used with a view to obtaining the finest possible grain size.

This process consists of surrounding the continuous casting mould with one or more coils traversed by an industrial frequency monophase current. The interaction between the circular current induced in the liquid metal and the axial magnetic field created by the coil gives rise to electromagnetic forces in meridian planes, which ensure a stirring of the metal in each of the meridian planes of the ingot mould.

As stated in the above patent, this stirring has the effect of shattering the dendrites formed in the vicinity of the solidification front into finer particles and to bring these particles into a hotter area, where a partial external remelting leads to their spheroidization. Therefore the grain is significantly refined.

However, the protection given by the present application is not limited to the use of this electromagnetic stirring procedure. In fact, it extends to the combination of the aforementioned heat treatment with any electromagnetic stirring method, for example:

The use of one or more coils surrounding the ingot mould and traversed by monophase currents of different frequencies, which can be higher or lower than the industrial frequency.

The concomitant use of a so-called "hot top" mould having an upper hot part, whose wall is thermally insulating and a lower cold part, whose thermally conducting wall is cooled by a fluid and a series of inductors constituted by annular coils surrounding the hot and cold parts and supplied with polyphase current in such a way that within the liquid metal is created a sliding alternating field leading to a vigorous stirring of the metal in the meridian planes of the ingot mould. Such a process is described in the not published French patent application 90 00516 belonging to the present Applicant. The object of this application is the production of thixotropic metal billets, but the process described leads to a fractionation of the dendrites and consequently to a refining of the grain, so that it can be readily applied in combination with the aforementioned heat treatment to the production of targets.

The use of a bipolar induction motor stator creating a rotary magnetic field in a plane perpendicular to the axis of the ingot mould. In this case, the interaction of this field with the current induced in the metal generates electromagnetic forces, which are no longer located in the meridian planes, but which are instead in horizontal planes tangential to the mould. Such a process is e.g. described in French patent 2 449 499 (ITT INDUSTRIES INC.). There again the aim is to produce thixotropic metal, but the fractionation of dendrites leads in the same way to a refining of the grain, so that this casting process can also be used in the production of targets.

DESCRIPTION OF THE DRAWINGS

The present invention will be better understood with the aid of the following drawings, wherein show:

In FIGS. 1 and 2 the time is plotted on the abscissa and the temperature on the ordinate. The dotted line portion of each of the two curves represents the cold working given to the disk by axial compression following cooling.

Figure 1:
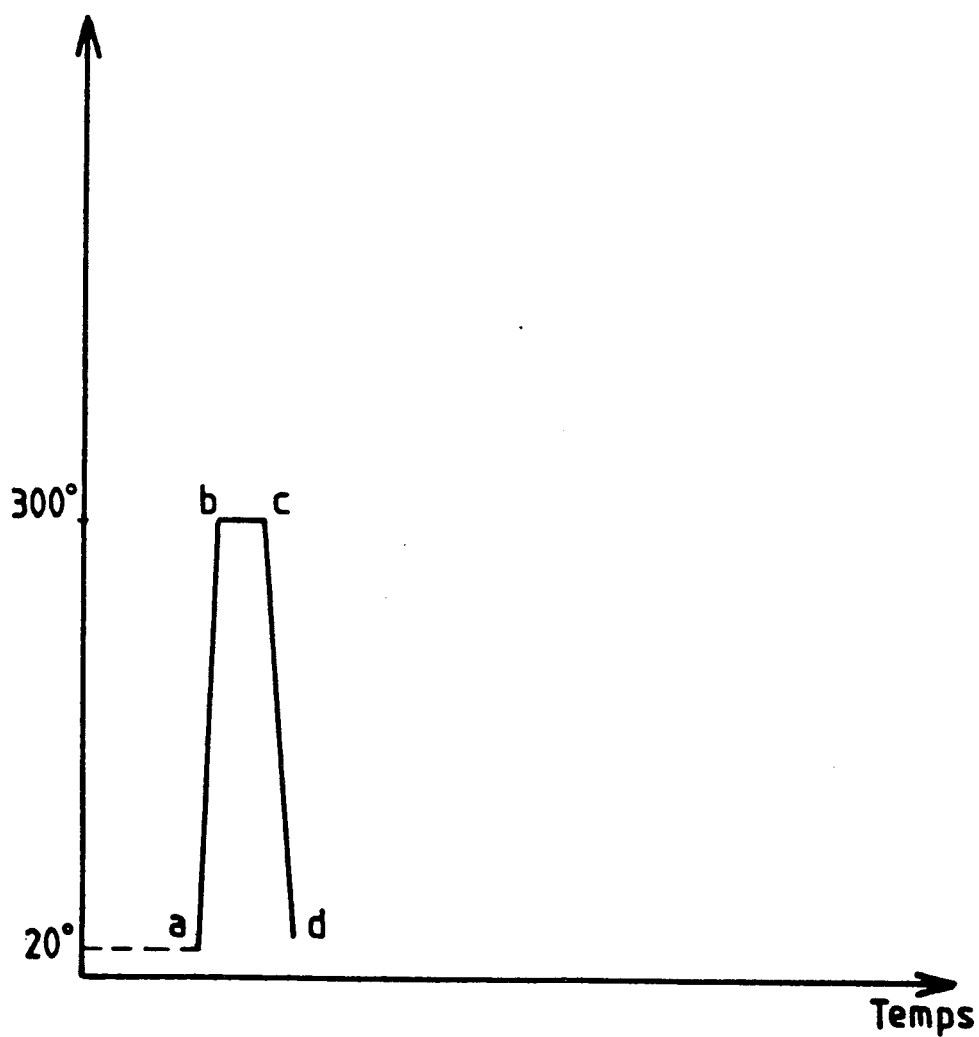
FIG. 1 The prior art thermomechanical treatment cycle.

The cycle according to FIG. 1 is very simple. Following the cold working stage, the recrystallization stage is characterized by a rapid rise up to a temperature between 300° and 350° C. (curve a b) and then maintaining at this temperature for between 5 minutes and 2 hours (curve b c). After this, the disk is cooled to ambient temperature by natural convection cooling (curve c d).

Figure 2:
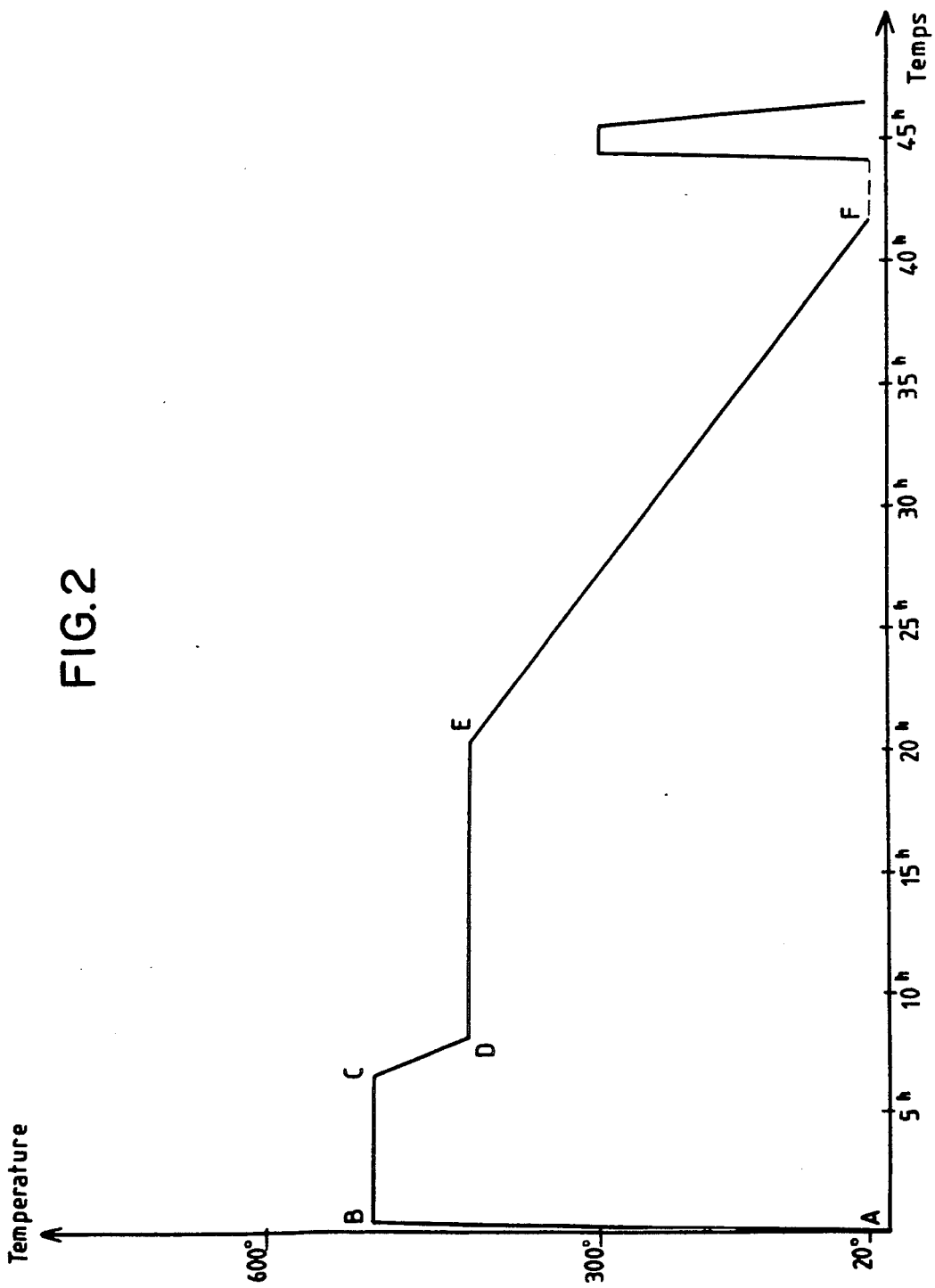
FIG. 2 The thermomechanical treatment cycle according to the invention.

The cycle of FIG. 2, according to the invention, is slightly more complex. The disk is raised to the homogenization temperature of 450° to 570° C. (curve A B), is maintained at this temperature for a time exceeding 4 hours (curve B C). The controlled cooling at a rate between 10° and 200° C./hour is indicated by curve C D. A temperature between 330° and 450° C. is then maintained for more than 1 hour (curve D, E), followed by cooling to ambient temperature at a rate between 5° and 100° C./hour (curve E F). As from point F, the cold working and recrystallization stages of FIG. 1 take place.

Figure 3:
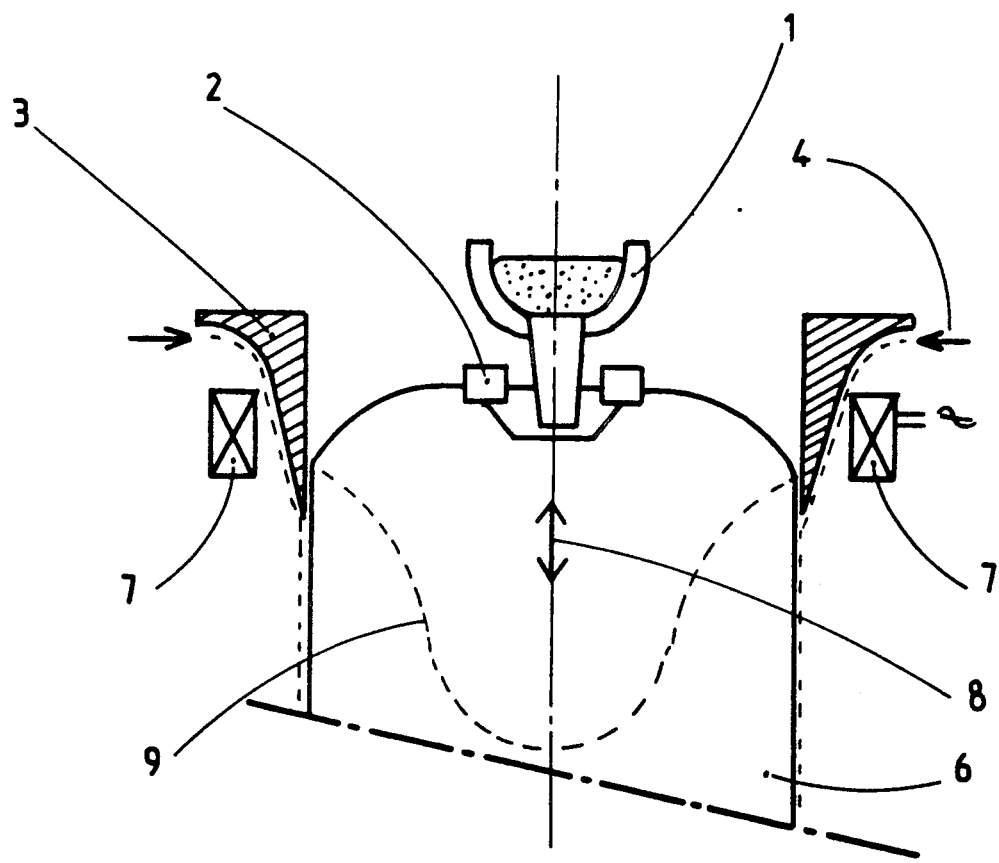
FIG. 3 Diagrammatically the continuous casting apparatus used in preferred manner according to the invention.

FIG. 3 shows the preferred semicontinuous casting process according to the invention. It is possible to see a liquid metal supply nozzle 1, a level regulating float 2, an ingot mould 3 externally cooled by a fluid (4) and which then trickles along the billet (6). The ingot mould is provided with an inductor (7), supplied with an alternating voltage in order to create an alternating field of direction (8) which, by interacting with the current induced in the billet, will give rise to electromagnetic forces leading to a vigorous stirring of the liquid metal of the liquid part located above the solidification front (9) and will therefore refine the grain.

EXAMPLE

An aluminium-silicon alloy containing 1% by weight silicon was prepared from refined silicon and aluminium. This liquid alloy was subdivided into two batches. Using the first batch, a diameter 250 mm billet was continuously cast in the conventional manner, apart from the fact that a graphite, bladed rotary stirrer was placed in the liquid part. The billet obtained was cut into 60 mm thick disks. Each of these disks was then crushed with a press in order to bring its thickness to 25 mm. The disks then underwent a recrystallization treatment lasting 1 hour at 300° C. and were then cooled to ambient temperature. Micrographic examination of the grain revealed an average grain size of 230 micrometers.

Using the second batch, casting took place in an ingot mould surrounded by an inductor of the type described hereinbefore of a billet having the same diameter. The inductor was constituted by a reel formed by 120 diameter 3.5 mm enamelled copper wire turns. Its external diameter was 330 mm, its internal diameter 280 mm and its height 43 mm. It was supplied with a voltage of 100 V. The thus obtained billet was cut into 60 mm thick disks. Each disk was firstly homogenized at 540° C. for 6 hours and then cooled to 440° C. at a rate of 60° C./hour. It was then left for 12 hours at 440° C., followed by cooling to ambient temperature at a rate of 20° C./hour. Each of these disks was then crushed with the press to bring the thickness to 25 mm. The disks then underwent a recrystallization treatment lasting 1 hour at 300° C. and were then cooled to ambient temperature. Micrographic examination of the grain revealed an average grain size of 70 micrometers.

We claim:

1. Process for producing fine grain targets for cathodic sputtering of aluminum in vacuo, said process comprising the following steps:
   (a) producing from aluminum having a purity of at least 99.99% an aluminum-silicon alloy containing 0.05% to 2% silicon, the balance being aluminum;
   (b) molding said aluminum-silicon alloy in the form of disks or semicontinuously casting in the form of billets and cutting the billets into disks,
   (c) homogenizing the disks at a temperature between 450° and 570° C. for at least four hours to pass precipitated silicon into solid solution;
   (d) subjecting the disks to controlled cooling at a rate comprised between 10° C./hour and 200° C./hour to a fixed temperature between 330° and 450° C.,
   (e) optionally maintaining the disk at said fixed temperature for at least one hour so as to complete precipitation and spheroidization of the silicon;
   (f) controlled cooling at a rate comprised between 5° C./hour and 100° C./hour to ambient temperature;
   (g) carrying out deformation to reduce the thickness of the disk, while simultaneously homogeneously increasing dimensions of the disk in all directions perpendicular to said thickness; and
   (h) carrying out a recrystallization treatment at a temperature between 300° and 350° C. for a time comprised between five minutes and two hours and cooling to ambient temperature.

2. Process for the production of fine grain targets for the cathodic sputtering of aluminum in vacuo according to claim 1, wherein, the homogenization temperature is about 540° C.

3. Process for the production of fine grain targets for the cathodic sputtering of aluminum in vacuo according to claim 1, wherein, in order to refine foundry grain, electromagnetic stirring is applied to the aluminum-silicon alloy within a semi-continuous casting ingot mold.

4. Process for the production of fine grain targets for the cathodic sputtering of aluminum in vacuo according to claim 3, wherein the electromagnetic stirring is obtained by applying a variable intensity magnetic field substantially parallel to an axis of the ingot mold.

5. Process for the production of fine grain targets for the cathodic sputtering of aluminum in vacuo according to claim 4, wherein the magnetic filed is obtained with the aid of at least one coil arranged around the ingot mold and supplied with industrial frequency alternating current.

6. Fine grain target for the cathodic sputtering of aluminum in vacuo, made of an aluminum alloy containing 0.05% to 2% silicon, the balance being aluminum having a purity of at least 99.99%, and having a grain size after recrystallization below 100 micrometers.

* * * * *

UNITED STATES PATENT AND TRADEMARK OFFICE
CERTIFICATE OF CORRECTION

PATENT NO. : 5,160,388
DATED : November 3, 1992
INVENTOR(S) : Legresy et al

It is certified that error appears in the above-identified patent and that said Letters Patent is hereby corrected as shown below:

On the title page, item [30]:
In the heading please correct the priority document number to read --90 09397 --.

Signed and Sealed this

Thirty-first Day of May, 1994

Attest:

BRUCE LEHMAN

Attesting Officer     Commissioner of Patents and Trademarks